United States Patent [19]

Rotolante et al.

[11] 4,449,044

[45] May 15, 1984

[54] FOCAL PLANE PHOTO-DETECTOR MOSAIC ARRAY APPARATUS

[75] Inventors: Ralph A. Rotolante, Acton; Toivo Koehler, Lexington, both of Mass.

[73] Assignee: Carson Alexion Corporation, Costa Mesa, Calif.

[21] Appl. No.: 262,296

[22] Filed: May 11, 1981

Related U.S. Application Data

[62] Division of Ser. No. 15,070, Feb. 26, 1979, Pat. No. 4,290,844.

[51] Int. Cl.³ .............................................. H01J 40/14
[52] U.S. Cl. ................................ 250/211 J; 250/578; 357/32
[58] Field of Search ................ 250/578, 211 J, 211 R; 357/71, 31, 32, 30, 29; 29/577 R, 572

[56] References Cited

U.S. PATENT DOCUMENTS

3,206,832 9/1965 Strother .................................. 29/572
4,197,633 4/1980 Lorenze, Jr. et al. ............. 29/577 R
4,354,107 10/1982 Carson et al. ........................ 250/578

Primary Examiner—David C. Nelms
Assistant Examiner—J. Brophy
Attorney, Agent, or Firm—Thomas J. Plante

[57] ABSTRACT

A focal plane detector mosaic array is formed by securing wafers of the detector material to a focal plane having individual conductor leads embedded therein, ion milling to delineate separate detector islands in individual electrical contact with the conductor leads, and using ion implantation to form p-n junctions in the detector islands.

10 Claims, 11 Drawing Figures

FOCAL PLANE PHOTO-DETECTOR MOSAIC ARRAY APPARATUS

This is a division of application Ser. No. 15,070, filed Feb. 26, 1979 now U.S. Pat. No. 4,290,844.

BACKGROUND OF THE INVENTION

This invention relates to the field of electro-optical detecting apparatus which utilizes "mosaic" detector arrays to provide surveillance of an extensive scene. The mosaic detector arrays are large numbers of closely-spaced individual photo-detector elements arranged in essentially a two-dimensional, or planar, array. The present invention is specifically concerned with a method, and resulting product, in which the photo-detectors are emplaced on, and integrated with, the supporting structure, the supporting structure containing electrically-conducting leads which are exposed as spaced contact points on the focal plane of the structure and which are intended to be individually in electrical contact with separate photo-detectors.

An earlier patent application of Carson and Dahlgren, Ser. No. 855,242, filed Nov. 28, 1977, and assigned to the assignee of this application, discloses a detector module comprising a number of thin insulating layers, or substrates, secured together and extending at right angles to the focal plane of the detector array. Electrically-conducting leads are supported by and located between such layers for the purpose of conducting signals away from the detectors located in the focal plane. The pre-fabricated layered supporting structure thus constitutes the substrate for the detector array. The earlier application refers to the step of "detector integration", wherein "the photo-detectors are emplaced on the focal plane end of the module, in contact with the thin film conductors formed between the thin module layers." Reference is made in that application to "a proprietary process of the assignee of this application" which was developed with particular reference to the use of mercury-cadmium-telluride detectors.

The present application relates to the process referred to in the prior application, but its usefulness is not limited to mercury-cadmium-telluride (HgCdTe) detectors.

Great difficulty has been encountered in satisfactorily emplacing detectors on the focal plane face of the supporting module. The requirements are very stringent because the goal is to end up with thin diode chips attached to the end of the module and in electrical contact with the lead points on the module. Thus, each detector must be separately in electrical contact with an individual electrical lead in the supporting module. This means that the detectors, which are very small and very closely located, must be electrically isolated from one another, and must each be located on top of one of the thin film electrical leads. The chances for the fabrication to fail are extremely high. To the best of the applicant's knowledge, present fabrication method is the first successful effort to deal with the complex and frustrating problems involved.

Previous efforts to emplace detectors on a supporting structure having conductor contact points on its surface have involved using detectors in which p-n junctions have been previously formed and separated into mesas, and securing the detectors to the supporting structure in electrical contact with the conductor end points by placing minute solder bumps on the individual points and aligning the mesas with the solder bumps as the detector material is placed against the supporting structure.

The accompanying Prior Art Statement includes additional information concerning the efforts to integrate focal plane photodetectors.

SUMMARY OF THE INVENTION

In general, the present invention solves the problem by utilizing the following steps:

(a) The focal plane of the structure is covered with a thin electrically conducting adhesive layer;

(b) A thin slab, or wafer, of the basic diode material is placed on the focal plane and secured thereto by the conducting adhesive material;

(c) The wafer of basic diode material is formed into a large number of very small, electrically isolated, individual detectors by a delineating method which forms an insulating, or separating, space around each detector "island". This is accomplished by removing both the basic detector material and the adhesive material to create the separating space around each detector, preferably using an ion beam milling process to cut through both materials; and (d) Thereafter photo-diodes are created by simultaneously forming p-n junctions in all the detector "islands", preferably by an ion implantation step.

There are a number of additional steps which are useful in providing a satisfactory detector array, which steps will be included in the detailed explanation below.

A major benefit of the present invention is that it maximizes the focal plane "area fill factor" or "density" of detectors in the mosaic, because the ratio of the infrared sensitive detector area to total focal plane area is extremely high.

DETAILED DESCRIPTION OF PREFERRED FABRICATION

Figure 1:
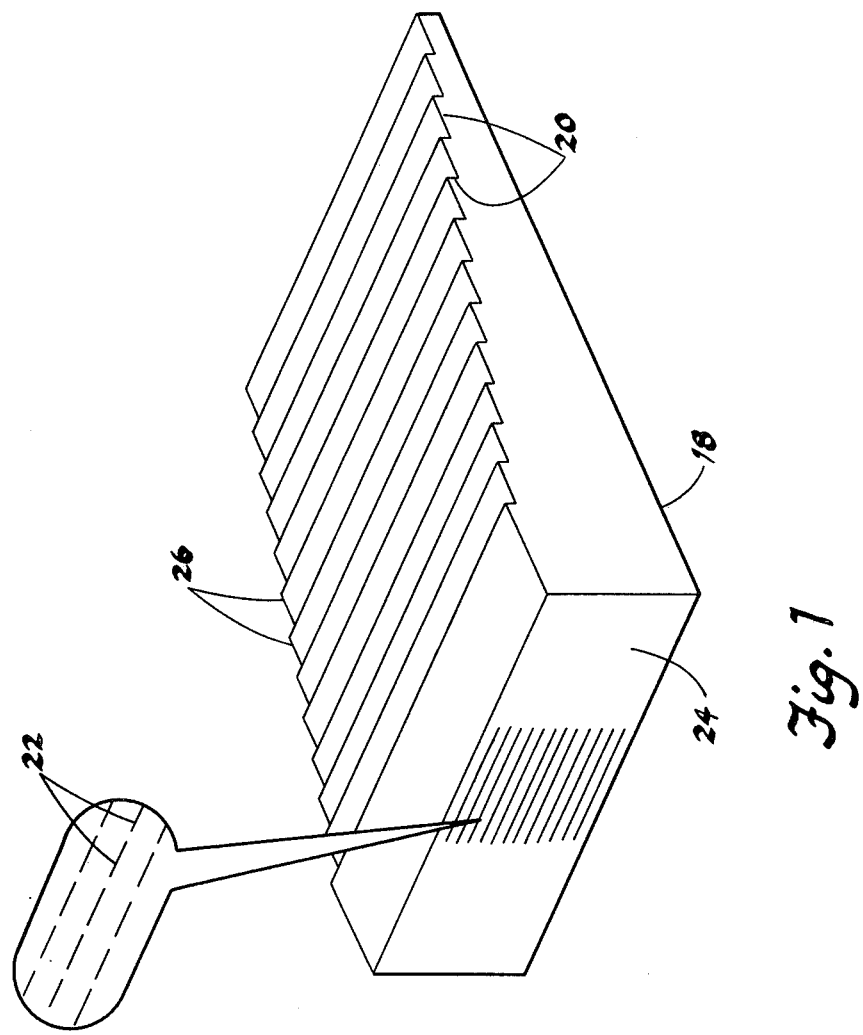
FIG. 1 is a view in perspective of an exemplary detector array module having a plurality of conductor-providing layers, and having at one end a focal plane detector mosaic array.

FIG. 1 shows a multi-layer module 18 consisting of a plurality of thin insulating wafers, or substrates, 20, each of which has on its surface a large number of essentially parallel electrically-conducting leads. The leads end at points 22 (see enlarged segment) located on the focal plane surface 24 of the module. The layers 20 are preferably formed from ceramic material, and the electrical leads thereon are preferably thin film conductors formed by a photo-delineation process, in which the unwanted portions of a thin metallic film are etched away to provide the desired conductor pattern.

In the module 18 illustrated in FIG. 1, there are 13 ceramic layers, each of which, in the preferred version, is 0.004 in. thick. The thin film conductors, or leadouts, preferably formed of gold, are designed to be spaced from one another 0.004 in., and in the version illustrated there are 48 leadouts on each layer, so that the focal plane 24 of the module has 12×48, or 576, separate leadout contact points 22. These contact points 22 appear as elongated contact points in the greatly enlarged take-off view associated with FIG. 1 because they are thin film conductors which are usually about 1–2 mils wide and only about 0.1 mil thick. Obviously, the dimensions and quantities used can be varied without departing from the principles of our technology.

The lengths of the ceramic layers are staggered, as shown, to give access to the lead pads 26 on the face of each layer.

As will be explained in detail, infra, thin photodiodes are attached to the end 24 (focal plane) of the module over each lead 22. The suggested diode dimensions are 0.0035 in.×0.0035 in., with 0.0005 in. spacing. The p regions of the diodes are in contact with the leads carried by the module layers 20, whereas the n regions of the diodes are joined by a common electrode formed on the top of the finished structure.

The following is a detailed step-by-step explanation of the presently preferred process for emplacing the photodiodes on, and integrating them with, the layered module 18:

Step 1. Lap and polish HgCdTe plank, or wafer.

Figure 2:
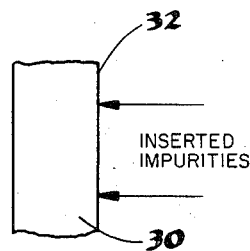
FIG. 2 is a side view of a greatly enlarged portion of a slice, or wafer, of the basic diode material which is to be used in fabricating the detector array.

A plank, or wafer, 30 (see FIG. 2) of HgCdTe (mercury-cadmium-telluride) is cut from an ingot so that it has approximate dimensions of 0.2 in.×0.2 in.×0.4 in. (for modules having 12×48 contact points on their focal plane surfaces). The cuts are made with a wire saw parallel to the crystal axis. The wafer 30 is lapped to remove irregularities which were produced by the saw. A thermal probe measurement is made to determine if the material is p-type. A density measurement is made to confirm material composition and wavelength. The wafer is then cut into 0.080 inch strips which are suitable for mounting on the focal plane face 24 of the module.

Step 2. Plate gold p+ back contact.

In order to improve the conductivity between the wafer and the contact points 22, a p+ region is formed at the "back" of the wafer on top of which is plated a layer of conducting material. The p+ region may be formed by inserting impurities, as shown. Then the HgCdTe wafer 30 is mounted on a glass slide carrier with Kodak KMER photoresist used to protect the front and sides of the material. The exposed back surface 32 is immersed in an electroless gold plating solution for one minute. The solution is 0.1 M $AuCl_3$ dissolved in deionized water.

Step 3. Epoxy HgCdTe to face of module.

Figure 3:
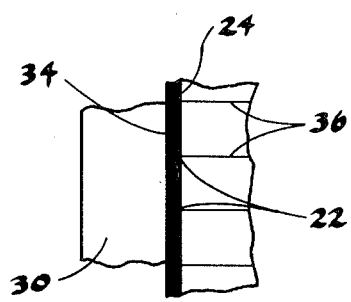
FIG. 3 is a greatly enlarged side view of the wafer of diode material shown in FIG. 2 mounted on and secured to the focal plane face of the module shown in FIG. 1.

The next step is to secure the wafer 30 to the face 24 of the module. A thin layer 34 (less than 5 micrometers) of silver epoxy is spread over the face 24 of module 18, and the wafer 30 is placed thereon (see FIG. 3). The function of the conducting epoxy is to bond the thin HgCdTe diodes formed from the wafer to the module, and to provide electrical continuity to the contacts 22 in the module. (Note that separate buried electrical leads 36 shown in the figure are associated individually with each contact point 22.) The epoxy thickness must be tightly controlled to make subsequent ion milling delineation operations feasible. Excessive thickness leads to milling times beyond the milling mask capability. Thicker milling masks cannot be used because of a loss of edge definition. The epoxy must also survive temperatures of 290° C. required for post-implant damage removal annealing. The epoxy must be compatible with subsequent chemical treatments (trichloroethelyne). Epotek H20E epoxy meets these criteria. Epoxy is considered superior to edtectic solders because of higher shear stress and strain limits.

Step 4. Cure of epoxy.

The epoxy 34 is cured overnight at 80° C. to minimize residual stress.

Step 5. Lap and polish wafer to reduce thickness.

The wafer 30 still requires substantial reduction in its thickness. A thickness of approximately 30 micrometers is reached by lapping and polishing, which is close to the desired final thickness (15–20 micrometers). Final thinning is produced by etching. Prior to this development, lapping of HgCdTe had not been performed in this configuration. There is a significant advantage in performing the lapping or polishing on the wafer after it has been secured to the module, because the module provides a support, or backing, during the procedure.

Step 6. Etch to further thin wafer.

The HgCdTe is etched to its final thickness in a 20% bromine, 80% methanol standard etch. This etch removes lapping damage and provides a good polished surface.

Step 7. Apply titanium mask preparatory to delineation of individual detectors.

Figure 4:
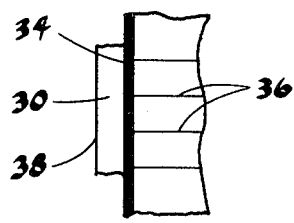
FIG. 4 shows the structure of FIG. 3 after thinning of the diode wafer.

Titanium is sputtered on the surface 38 (FIG. 4) of the wafer 30, in order to provide an ion beam milling mask. The suggested thickness of the mask is 0.8 micrometer. Adhesion problems occur if the HgCdTe is contaminated.

Step 8. Photo-etch pattern in titanium mask.

Figure 8:
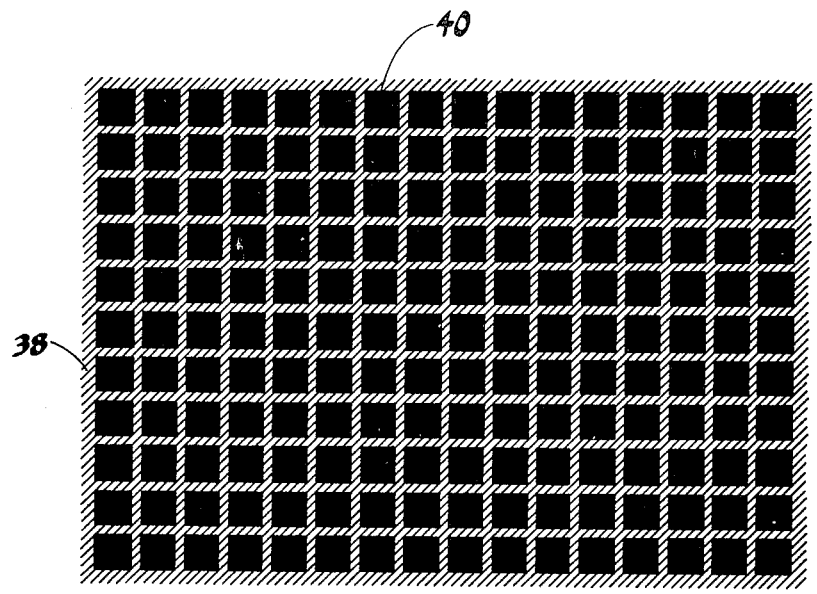
FIG. 8 is a greatly enlarged plan view of the focal plane showing the titanium mask used during the diode-delineating portion of the process.

The function of this step is to etch the mosaic detector pattern into the titanium in alignment with the contacts 22 in the focal plane surface of the module 18. The pattern of the titanium mask is shown in FIG. 8, indicated by the numeral 40. This mask etching step includes three operations: (1) application of photoresist and development, (2) mask alignment and exposure to ultraviolet, and (3) etching to clear titanium in undesired regions. Special fixturing has been used to align and expose the pattern. A Nikon toolmaker's microscope was modified with a board and mask manipulator. Mask alignment was accomplished by alignment marks on the fixture and the microscope cross-hairs. The contact between mask and module was manual. The pattern was etched in a 20% hydrofluoric solution. Clearing was determined by color change from blue to yellow.

Step 9. Ion beam mill through HgCdTe and epoxy.

Figure 5:
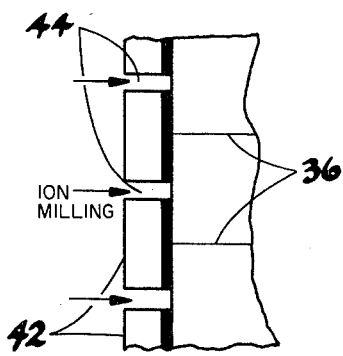
FIG. 5 shows the structure of FIG. 4, enlarged even more, after delineation of separate diodes in the array has been accomplished by means of ion milling.
Figure 9:
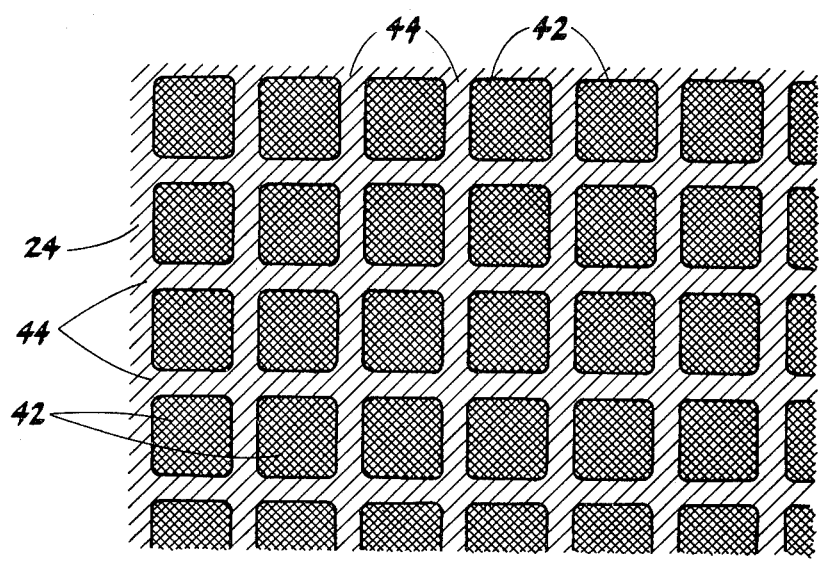
FIG. 9 is a greatly enlarged plan view of the focal plane showing the delineated diodes, or detector islands, with insulating filler in the spaces between the islands.

The function of this step is to cut through the HgCdTe wafer 30 and the epoxy layer 34, so as to electrically isolate the individual HgCdTe detector elements. FIGS. 5 and 9 show the electrically isolated detector elements 42, which are, in effect, "islands" surrounded by criss-crossing spaces, or "channels", 44 which provide electrical separation and insulation between adjacent detector elements. Each element is in electrical contact with an individual contact point 22 and its buried thin film electrical lead 36 which conducts the detector signal to the interior of the module assembly.

This detector delineation step obviously is of crucial importance, and involves numerous practical problems. Ion beam milling is the best method of separating the detectors, but it in itself requires solution of further problems. The ion beam milling acts on the titanium mask 40, as well as the wafer 30 and epoxy 34, so the mask must be designed to survive until the detector islands 42 have been fully cut off from one another. During milling, oxygen is introduced into the system to oxidize the titanium and thereby reduce its milling. The approximate milling rates are as follows:

$TiO_x$ mask—0.03 micrometers per hour

H20E epoxy—1.00 micrometers per hour

HgCdTe—5.00 micrometers per hour

The argon milling beam has an energy of 10 keV and a power level of 0.2 Watt/cm$^2$. A typical milling situation would consist of 5 micrometers of epoxy, 20 micrometers of HgCdTe, and 0.8 micrometer of $TiO_x$ mask. Total milling time for this operation is 9 hours. In case of thickness variations (say, 10 micrometers of epoxy and 40 micrometers of HgCdTe), the milling time could be as high as 18 hours. The process would still be acceptable because the mask can survive for 25 hours. With better thickness control the mask thickness can be reduced to achieve better edge definition.

Prior to reaching the solution of the detector delineation problem by using a titanium mask and ion beam milling, other approaches to the problem were unsuccessfully tried. Plasma ashing was tried as a means of removing the detector and epoxy material, but the uncollimated beam tended to "undercut", whereas the collimated beam of the ion beam milling generally avoided the undercutting difficulty. Where the undercutting during the plasma ashing process acted on the epoxy, it tended to cause the detector "chips" to fall off the module.

The first masking effort used Kodak 747 photoresist, but mask failure resulted before delineation was completed through the epoxy. Since epoxy is more resistant to the milling process than the HgCdTe material, another effort to solve the problem was to eliminate the need for removing epoxy by not applying it to the back of the HgCdTe wafer where the channels 44 were to be cut. In other words, a "mesa" pattern was etched on the backside of the HgCdTe wafer and epoxy applied only to the mesa tops. But the alignment tolerances were not adequate to produce an ion milling mask in registration with the backside mesas.

Step 10. Inspection to check for electrical isolation.

In order to determine if the delineation has been successful, two inspections are performed. A visual inspection reveals ceramic material of the module layers 20 appearing between the detector islands 42. Laminations are clearly visible. Lead alignment can also be determined. Laminations should pass through detector elements and lead ends should not be visible. An electrical test for continuity between combinations of stub board pads demonstrates electrical isolation. This test can also be used during the milling process.

Step 11. Remove titanium mask.

At this point the titanium mask 40 should be removed. This can be accomplished by etching with dilute hydrofluoric acid, the same material as that used during Step 8, in which the desired delineation pattern was etched in the titanium mask.

Step 12. Final surface cleaning.

In order to decrease shunt resistance (leakage paths) around the diodes, and thus provide better detection characteristics, it is desirable to clean and smooth the surfaces of the delineated detectors 42. This may be done by briefly etching in 5% bromine in methanol.

Step 13. Passivation.

Figure 6:
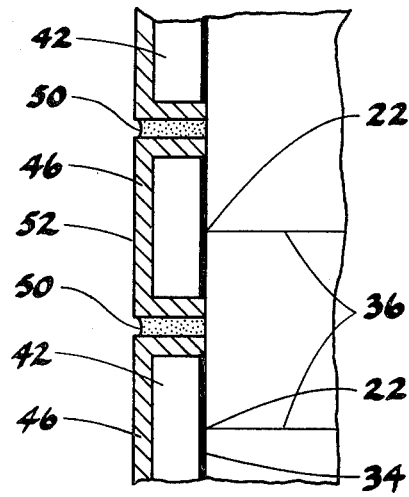
FIG. 6 shows the structure of FIG. 5 after passivation and filling.

In order to encapsulate the HgCdTe detectors 42 and preserve their surface properties, a passivation step is performed, using a material which is transparent to infra-red radiation. A zinc sulfide (ZnS) coating 46 is provided (see FIGS. 6 and 10), by evaporating 100 Å of ZnS. A problem encountered was the inadequate covering of the sides 48 of the detector elements 42 with ZnS. The result was shorting of the detector elements during subsequent formation of the common electrode indium grid. This problem was solved by changing the angle of incidence of the evaporating ZnS material particles against the focal plane of the module from normal to 30° from normal, and rotating the module during the evaporation step.

Step 14. Deposit dielectric filler in channels between detector elements.

The cuts, or channels, which separate the detector elements are filled with a dielectric material 50, such as Kodak 747 photoresist. The purposes of the dielectric filler material 50 are to provide a supporting surface for the common electrode which is formed later, and also to provide lateral mechanical support for the individual detector elements 42 and prevent their displacement. The dielectric material also serves the function of a mask during the subsequent ion implantation step. After the dielectric material has been applied to the focal plane, a mask is applied to cover the detector elements. Then the region of the channels, or cuts, 44 is exposed to ultraviolet radiation, in order to polymerize the photoresist material 50 in the channels. Photographic developer is then used to remove any photoresist material from the tops 52 of the detector elements, leaving the ZnS and passivation material 46 intact. In filling the channels with the dielectric material 50, care must be taken to avoid failure to fill at the channel intersections.

Step 15. Creation of diode junctions in detectors by ion implantation process.

The usual method of diode junction formation is diffusion, in which dopant impurities are dissolved into the diode material by thermal energy. The diffusion process is not practical in the present situation, primarily because the heating required (e.g., 600° C.) would cause the metallized electrical contacts to diffuse into the detector material, thereby shorting the individual detectors 42.

Figure 7:
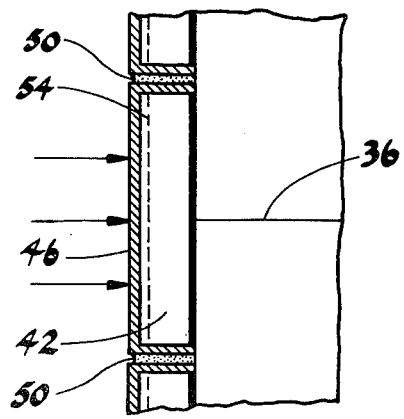
FIG. 7 shows the structure of FIG. 6 after the diode junctions have been created by ion implantation.
Figure 10:
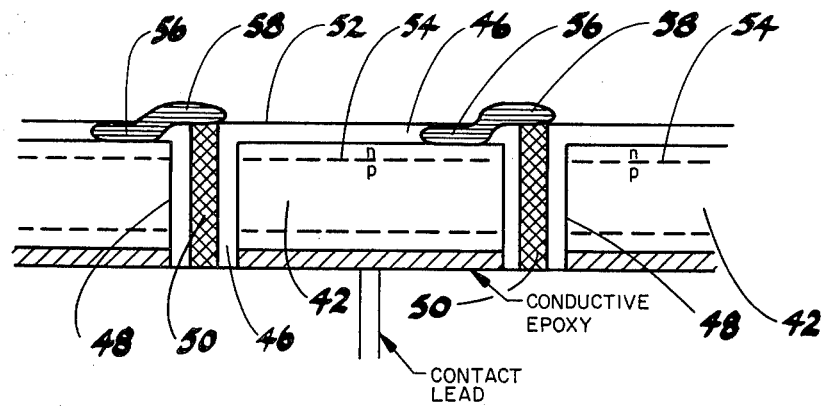
FIG. 10 is a greatly enlarged cross-sectional view of the final diode array, showing the insulation between diodes and also the electrically conducting material placed on top of the diode array in order to provide a conducting grid, or network, which interconnects the diodes to provide a common electrode.
Figure 11:
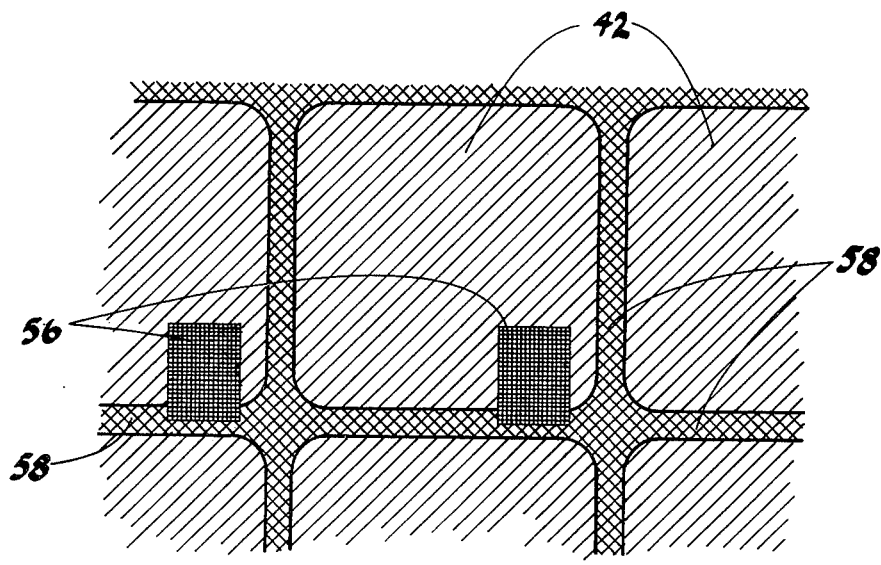
FIG. 11 is a greatly enlarged plan view of the final diode array, showing the final surface having a common electrode grid on top of the focal plane.

Ion implantation is the solution of the diode junction forming problem. In this process, impurity ions are injected through the passivation layer into the HgCdTe detectors to create an n-type layer which provides a diode junction 54 in each detector, as shown in FIGS. 7 and 10. The ion implantation process has been described in various publications, including those cited in the accompanying prior art statement.

Initially, aluminum ions were tried as the donor, or implant, material. While aluminum ions succeeded in forming diode junctions in HgCdTe material of the type sensitive to short wavelength radiation (i.e., 3-4 micrometers), they did not produce junctions in HgCdTe of the type sensitive to longer wavelengths. This points to the conclusion that the implantation reported by prior publications, and experienced in our experimental work, occurred due to implant damage rather than donor impurity implanting. It appears that aluminum has relatively low doping efficiency.

We have found that boron ions will successfully implant to form junctions in HgCdTe material of the type sensitive to 6.5 micrometer wavelengths. The dose of boron ions used is $10^{13}$ cm$^{-2}$ B+ ions.

Step 16. Post implant anneal.

It is desirable to perform an annealing step after implanting the boron ions. This is being done by annealing for 45 minutes at 200° C., a schedule which has not been experimentally optimized. Annealing is not performed after aluminum ions have been used to create an implant damage junction.

Step 17. Photoetch holes in passivation for contact pads.

This operation provides electrical access to the n-layer of the diode. A layer of Shipley photoresist is spun on and baked. A pattern of one mil squares on 4 mil centers is exposed and developed. Holes are etched into the ZnS passivation with hydrochloric acid. The size of these holes is determined by present probing requirements. It is planned that these holes will eventually be ¼ mil square. This Shipley resist is left on for the next operation.

Step 18. Form indium contact pads.

A layer of 6000 Å of indium is evaporated on the top of the focal plane. The Shipley resist is removed and along with it the indium. This operation leaves indium contact pads 56 in the holes in the ZnS in contact with the HgCdTe n-layer. It is required that two different resists be used to provide the filler and indium lift-off masks, or the filler will be removed also.

Step 19. Forming indium common electrode.

Since a common electrode is needed on the top side of the photo-detector islands 42, an interconnecting metallic (indium) conducting grid is to be formed on top of the dielectric material 50 in the channels which separate the detector islands. It is necessary that this interconnecting conducting grid be so located as to interfere minimally with illumination of the detector elements. The first step is to form a grid contact pattern by photo-processing. A layer of Shipley photoresist is spun on and baked. A pattern of a grid 58 having 1×3 mil tabs is exposed thereon and developed. Indium is applied to cover the surface, preferably by being evaporated at an angle to the surface, in order to optimize continuity between the one mil indium pads 56 and the grid 58, which lies on top of the dielectric filler. Problems encountered in this operation may be caused by poor dielectric filler which fails to support the grid. A continuity check of the grid is made from one end of the surface to the other. Some surfaces require several iterations before continuity of the common electrode grid is established. A uniform dielectric filler can reduce or alleviate the need to iterate the indium evaporation at this point. Indium is thereafter cleared from the optically active regions by lifting off the Shipley resist.

Step 20. Inspection.

The board is inspected for completeness of the lift-off process and for electrical continuity of the common electrode.

Step 21. Testing completed structure.

Comprehensive testing is required. Current and voltage characteristics of all elements are probed. Each I-V curve is photographed. Zero bias resistance values are recorded. Note is also made of elements which have opens, shorts, high series resistance, or a common ground. Problems associated with the common electrode grid must be separated from other factors. Responsivity and quantum efficiency is then determined.

The steps included in the foregoing detailed description of the overall process all appear desirable at this time. However, some appear to be of greater significance than others. And, in particular, the following portions of the overall process stand out. The first, taken in order of occurrence, is securing the wafer of basic detector material to the module using a layer of conducting adhesive, a relatively simple and reliable process. The second is the thinning of the wafer after it has been secured in place, thereby greatly simplifying the handling procedure and reducing the risk of damaging the fragile material. The third is the delineation operation, in which many separate detector "islands" are formed from a wafer of material which has been secured to the supporting module. The fourth is the subsequent creation of diode junctions in the detector islands, a step which should be performed near the end of the fabrication operation in order to assure that the junctions will not be affected by subsequent processing.

As explained in the detailed outline of the process, the delineation step (the third mentioned in the preceeding paragraph) has required the solution of difficult problems, leading to the use of the ion milling process, and to a preference for titanium as the masking material. Also, the diode junction-forming step (the fourth step mentioned in the preceeding paragraph) has required the solution of difficult problems, leading to the use of the ion implantation process, and to a preference for boron as the impurity-implanting material.

There are numerous significant advantages accruing to the overall fabrication operation set forth in this application, as compared to prior efforts to manufacture a similar structure, e.g. efforts to manufacture a "back-side" illuminated detector mosaic structure, as explained above in discussing the Background of the Invention. Such advantages include the following:

(1) Since the conductor leads embedded in the module only need to touch the epoxy material, the photo-process used for registration of the detectors and their respective lead lines is not critical.

(2) Since the epoxy layer fills in deviations in the module surface, flatness tolerance of the module surface is not critical in order to insure detector-to-lead line contact.

(3) Thickness tolerance of the detectors is not critical because they are "frontside" illuminated, and their junctions, which are close to the light-receiving "top" of the structure, are located at a depth controlled by the ion implantation process.

(4) There is total optical and electrical isolation of the detector "islands" from one another because of the ion milling process, and because the common electrode is a separate grid formed on top of the island-isolating channels.

(5) There are minimal optical losses because of the "front-side" illumination.

(6) There is much safer handling (less damage) becuase there is no mechanical handling of the finished detector elements, or "chips".

(7) There is no thermal expansion matching problem involving the thermal properties of the ceramic material used in the layered module and the thermal properties of the detector material wafer. Otherwise, this could be a major difficulty in the very cold environments where such structures might be used.

(8) Partly because of avoiding the thermal expansion problem, the present fabrication method can be used with many other detector materials, i.e., semiconductor crystalline materials, such as indium antimonide, lead tin telluride, indium arsenic antimonide, indium arsenide, indium gallium arsenide, etc.

(9) Costly losses due to scrapping defective devices tend to be avoided because the devices become very expensive only after the diode junctions in the detector elements have been formed.

The claims appended hereto are intended not only to cover the specific embodiment disclosed, but also to cover the inventive concepts explained herein with the maximum breadth and comprehensiveness permitted by the prior art.

What is claimed is:

1. A focal plane photo-detector array structure comprising:
   a plurality of substrate layers secured together and extending at right angles to the focal plane, said layers supporting between them a multiplicity of separate electrical conductors which terminate in spaced contact points at the focal plane;
   a layer of electrically conducting bonding material on the focal plane ends of the substrate layers; and
   a multiplicity of individual photo-detectors which are physically and electrically isolated islands secured to the focal plane surface of the substrate layers by the bonding material, each island being located directly above, and connected electrically to, a single contact point provided by one of said electrical conductors.

2. The structure of claim 1 wherein each photo-detector has a diode junction formed in it closer to the top of the detector than to the detector surface secured to the substrate layers.

3. The structure of claim 1 or claim 2 wherein each detector is isolated from other photo-detectors by channels cut in a wafer of detector material.

4. The structure of claim 3 which also comprises:
   dielectric material substantially filling the channels between adjacent islands.

5. The structure of claim 1 or claim 2 wherein the photo-detectors are covered with a thin passivation layer of infrared-transparent material.

6. The structure of claim 1 or claim 2 which also comprises:
   a common electrode provided for the photo-detectors by a conducting grid formed on top of the photo-detector array in a pattern overlying the spaces between the detector islands.

7. The structure of claim 1 or claim 2 which also comprises dielectric material surrounding each photo-detector island.

8. The structure of claim 4 which also comprises:
   a common electrode provided for the photo-detectors by a conducting grid supported on top of the dielectric material which fills the detector-isolating channels.

9. The structure of claim 3 wherein the width of each detector-isolating channel is approximately 0.0005 inch.

10. A focal plane photo-detector array structure comprising:
    a plurality of substrate layers secured together and extending at right angles to the focal plane, said layers supporting between them a multiplicity of separate electrical conductors which terminate in spaced contact points at the focal plane;
    a layer of electrically conducting bonding material on the focal plane ends of the substrate layers;
    a multiplicity of individual photo-detectors which are physically and electrically isolated islands secured to the substrate layers by the bonding material, but isolated from one another by channels cut through a wafer of detector material and the bonding material;
    each photo-detector island being located directly above, and being connected electrically to, a single contact point provided by one of said electrical conductors;
    a diode junction formed in each photo-detector island closer to its top surface than to its bonded surface;
    a thin passivation layer of infrared transparent material covering the tops of the photo-detectors;
    dielectric material substantially filling the detector-isolating channels; and
    a common electrode for the photo-detectors provided by a conductive grid lying on top of the dielectric material.

* * * * *